United States Patent
Kawamura et al.

(10) Patent No.: US 8,446,556 B2
(45) Date of Patent: May 21, 2013

(54) FLEXIBLE PRINTED CIRCUIT AND ELECTRIC CIRCUIT STRUCTURE

(75) Inventors: Teruo Kawamura, Osaka (JP); Toshio Etoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 265 days.

(21) Appl. No.: 13/000,615

(22) PCT Filed: Jun. 24, 2009

(86) PCT No.: PCT/JP2009/061505
§ 371 (c)(1),
(2), (4) Date: Dec. 21, 2010

(87) PCT Pub. No.: WO2010/004875
PCT Pub. Date: Jan. 14, 2010

(65) Prior Publication Data
US 2011/0102729 A1 May 5, 2011

(30) Foreign Application Priority Data
Jul. 8, 2008 (JP) ................................. 2008-178299

(51) Int. Cl.
*G02F 1/1345* (2006.01)
(52) U.S. Cl.
USPC ............ 349/149; 349/150; 349/151; 349/152
(58) Field of Classification Search .................. 349/149, 349/150, 151, 152
See application file for complete search history.

(56) References Cited

U.S. PATENT DOCUMENTS 6,535,261 B1 * 3/2003 Anno et al. .................... 349/147
8,279,612 B2 * 10/2012 Murakami et al. ............ 361/749

FOREIGN PATENT DOCUMENTS

| JP | 2-9469 | * | 1/1990 |
| JP | 1990-9469 U | | 1/1990 |
| JP | H4-28437 U | | 3/1992 |
| JP | 2007-87999 | * | 4/2007 |

OTHER PUBLICATIONS

International Search Report (ISR) issued in PCT/JP2009/061505 (parent application) mailed in Jul. 2009 for Examiner consideration.

* cited by examiner

*Primary Examiner* — Mike Qi
(74) *Attorney, Agent, or Firm* — Chen Yoshimura LLP

(57) ABSTRACT

Provided are a flexible printed circuit that reduces the chance of the occurrence of short-circuit failures caused by swarf generated from punching out flexible printed circuit, and an electric circuit structure having this flexible printed circuit and an electric circuit substrate to which the flexible printed circuit is connected. A flexible printed circuit (100) has a wiring pattern (2) formed on the flexible base film (1). The flexible printed circuit (100) is individually punched out to be separated in a condition where the wiring pattern (2) is disposed on the base film (1), and the wiring pattern (2) has a narrowed portion (2c) near the edge of the base film (1).

6 Claims, 5 Drawing Sheets

FLEXIBLE PRINTED CIRCUIT AND ELECTRIC CIRCUIT STRUCTURE

TECHNICAL FIELD

The present invention relates to flexible printed circuits having wiring patterns formed on a base film, which flexible printed circuits are punched out to be individually separated, along with the wiring patterns, and an electric circuit structure comprising the flexible printed circuits and an electric circuit substrate to which the flexible printed circuits are connected. More particularly, the present invention relates to a flexible printed circuit and an electric circuit structure, in which wiring pattern swarf, generated from punching out the flexible printed circuits, does not cause a short-circuit failure.

BACKGROUND ART

A panel substrate, which is a component of a flat image display element such as a liquid crystal panel, is an electric circuit substrate having, on the inner surface, various electric circuit elements including pixel electrodes as individual units of image display, switching elements for applying certain voltages on pixel electrodes, and metal wiring.

Electrode terminals are disposed along the borders of the panel substrate of the liquid crystal panel, wherein the electrode terminals are drawn from the metal wiring formed over the image display region. Flexible printed circuits (FPC) are connected to these electrode terminals. Applied to the electrode terminals through the flexible printed circuits are various image display signals from peripheral circuit substrates and other components except the liquid crystal panel, as well as the power supply voltage required for the panel substrate to operate as an electric circuit substrate. Since the flexible printed circuits can be bent, the peripheral circuit substrate is bonded to the back of a bezel, a frame-like structural member with a bottom, in which the liquid crystal panel and the backlight are encased. This configuration constitutes a liquid crystal display device, which is an electric circuit structure.

The flexible printed circuit, which connects the panel substrate and the peripheral circuit substrate, includes a flexible base film having a particular wiring pattern on it. The wiring pattern is formed with metal foil (e.g., copper foil). Furthermore, the flexible printed circuit, together with the wiring pattern, is covered by an insulating protective layer. The flexible printed circuit is electrically connected to the panel substrate through an aperture in the base film that exposes the wiring pattern. Through the aperture, the wiring pattern makes direct contact with the electrode terminal on the panel substrate. Liquid crystal display devices also employ TCP (Tape Carrier Package), in which circuit elements such as driver semiconductor chips and capacitors that are connected to the wiring pattern are mounted on the flexible printed circuit.

For easy handling, in the case of TCP, flexible printed circuits having circuit elements such as semiconductor chips mounted therein are formed in multiples on a carrier tape so as to be individually separated for connection to the panel substrate by being punched out from the carrier tape in a predetermined shape by a metal cutter.

Patent Document 1 discloses a technology for forming a wiring pattern on a flexible printed circuit, wherein the lengths of individual wires on the flexible printed circuit alternate, having every other wire shorter, where the shorter wire does not extend to the punching line. According to this technology, a short-circuit failure caused by conductive foreign matter, i.e., a wire detachment from the base film triggered by the stress from the punching out process, can be prevented.

Patent Document 1: Japanese Utility Model Application Laid-Open Publication No. H4-28437

SUMMARY OF THE INVENTION

Problems to be Solved by the Invention

The conventional flexible printed circuit described above can prevent a short-circuit failure caused by wiring pattern swarf adhered to the edge of the flexible printed circuit generated upon punching out, but cannot prevent a short-circuit failure caused by the wiring pattern swarf adhered to other electric circuit substrates to which the flexible printed circuit is connected, such as the panel substrate.

The electrode terminals on the panel substrate are designed to have the largest possible width to minimize the resistance of the electric wiring, and therefore the interval between adjacent electrode terminals is narrower than the interval between adjacent wires of the wiring patterns on the flexible printed circuit, although the pitch of the electrode terminals is the same as that of the wiring pattern. For this reason, measures must be taken to prevent short-circuit failure on the panel substrate as well, as long as wiring pattern swarf is an unavoidable byproduct of the punching out process of flexible printed circuits.

It should be noted that, in the case of TCP, where a circuit element is mounted on the flexible printed circuit, all wiring patterns are sometimes formed across the punching line of the flexible printed circuit for quality inspection of the circuit components mounted on the carrier tape. In this case, the technology disclosed in Patent Document 1 is not applicable.

The present invention was devised in consideration of the issues described above, and is aiming at providing a flexible printed circuit having a reduced chance of short-circuit failure caused by wiring pattern swarf derived from punching out the flexible printed circuits, and an electric circuit structure having the flexible printed circuit and an electric circuit substrate to which the flexible printed circuits are connected.

Means of Solving the Problems

The flexible printed circuit of the present invention, devised to solve the problems discussed above, is a flexible printed circuit having a wiring pattern formed on the flexible base film, which is individually punched out to be separated in a condition that the wiring pattern is formed on the base film, and the wiring pattern has a narrowed portion near an edge of the base film.

The electric circuit structure of the present invention includes the flexible printed circuit of the present invention and an electric circuit substrate over which surface electric circuit elements and electrode terminals to which the electric circuit elements are connected are formed, wherein the wiring patterns on the flexible printed circuit are connected to the electrode terminals on the electric circuit substrate.

Effects of the Invention

According to the present invention, the length of wiring pattern swarf generated from punching out flexible printed circuits can be shortened. The present invention therefore provides a flexible printed circuit that prevents short-circuit failures caused by wiring pattern swarf, and an electric circuit structure having such a flexible printed circuit and an electric circuit substrate to which the flexible printed circuit is connected.

DETAILED DESCRIPTION OF EMBODIMENTS

Figure 1:
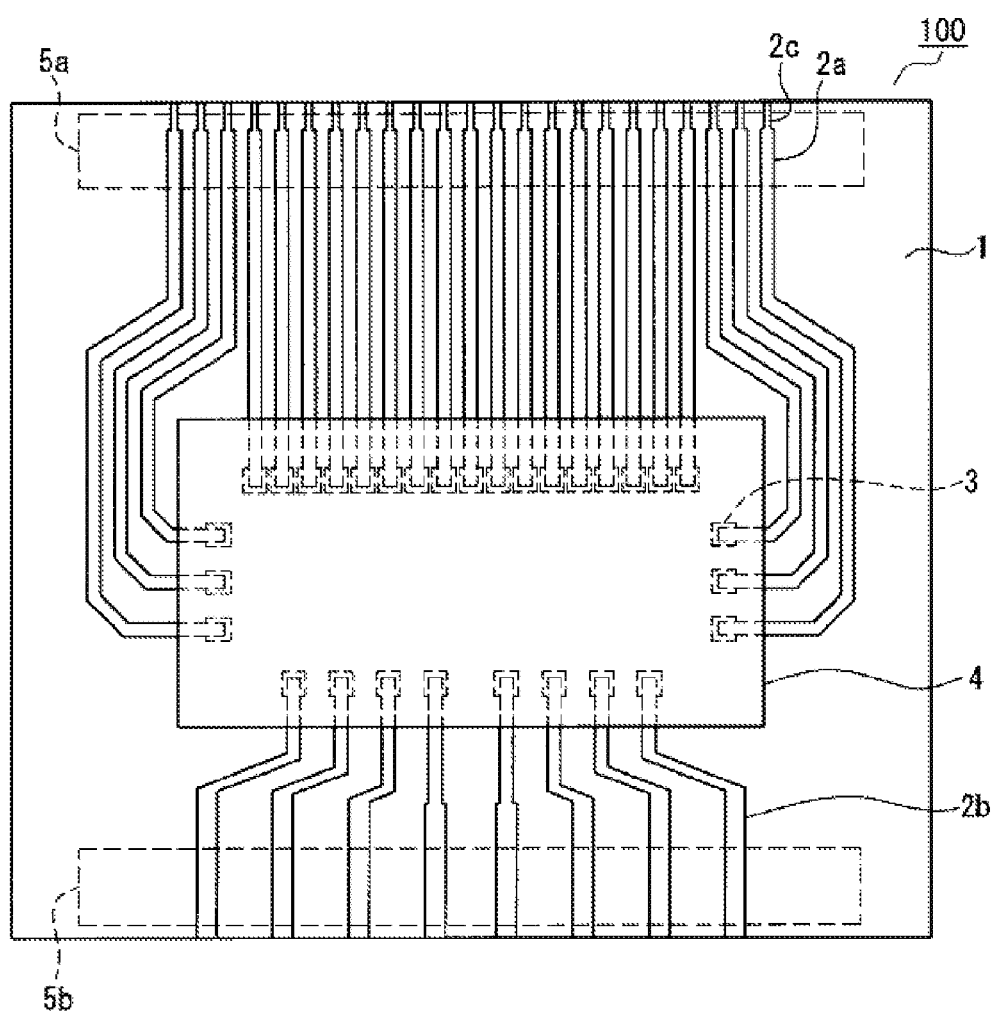
FIG. 1 is a plan view of the flexible printed circuit according to an embodiment of the present invention.

The flexible printed circuit of the present invention is a flexible printed circuit having a wiring pattern formed on the flexible base film, which flexible printed circuit is individually punched out to be separated, along with the wiring pattern on the base film, wherein the wiring pattern has a narrowed portion near on edge of the base film.

This structure limits the maximum length of the wiring pattern swarf generated from punching out the flexible printed circuits to the width of the narrowed portion of each wire in the wiring pattern, which is shorter than in the case of not having the narrowed portions. Therefore, even if the flexible printed circuit is used in a condition in which wiring pattern swarf is adhered to them, short-circuit failure caused by the swarf can effectively be prevented.

The flexible printed circuit having the structure described above preferably has the aforementioned narrowed portion whose width is narrower than the interval between the electrode terminals formed on the electric circuit substrate to which the flexible printed circuit is connected, wherein the wiring pattern on the side with the narrowed portion is connected to the electrode terminals. This way, the length of the wiring pattern swarf is shorter than the interval between adjacent electrode terminals on the electric circuit substrate to which the flexible printed circuit is connected, thereby almost definitely preventing short-circuit failures.

Furthermore, a circuit element connected to the aforementioned wiring pattern is preferably mounted on the flexible printed circuit so that the flexible printed circuit can be used as a TCP.

The electric circuit structure of the present invention includes the flexible printed circuit of the present invention and an electric circuit substrate over which surface electric circuit elements and electrode terminals to which the electric circuit elements are connected are formed, wherein the wiring pattern on the flexible printed circuit is connected to the electrode terminals on the electric circuit substrate.

This configuration provides an electric circuit structure that reduces the chance of short-circuit failure occurrences caused by the wiring pattern swarf generated from punching out flexible printed circuits along with wiring patterns on the base film.

The aforementioned electric circuit structure is preferably a liquid crystal display device, wherein the aforementioned electric circuit substrate is a panel substrate that, together with an opposite substrate to which the panel substrate is bonded through a liquid crystal layer with a predetermined gap therebetween, constitutes a liquid crystal panel.

Embodiments of the present invention are described below in reference to figures.

The following description of an embodiment of the present invention shows an example where the flexible printed circuit of the present invention is connected to the panel substrate of a liquid crystal panel to constitute a part of a liquid crystal display device. An example of the electric circuit structure of the present invention, in which the electric circuit substrate to which the flexible printed circuit is connected is the panel substrate that is a component of a liquid crystal panel, will also be described.

The following description, however, shall not limit in any way the applications of the flexible printed circuit and the electric circuit structure of the present invention. Electric circuit substrates to which the flexible printed circuit of the present invention is connected shall not be limited to a panel substrate of a liquid crystal panel. The flexible printed circuit of the present invention may be connected to a panel substrate of an image display device or other electric circuit substrates for a variety of applications, such as audio devices or data processing devices. Similarly, the electric circuit structure of the present invention shall not be limited to the one for a liquid crystal display device. The electric circuit structure of the present invention may be applicable to a wide variety of flat display devices such as inorganic EL displays and field emission cold cathode display devices. The electric circuit structure of the present invention shall be applicable not only to display devices, but also to various modules in which flexible printed circuits are connected to an electric circuit substrate, such as drive circuits of audio devices and data processing devices.

The following figures are schematic views of main members, among all other members, of an embodiment of the present invention in order to describe the present invention. Therefore, the display device of the present invention may have any other members which are not shown in the figures of reference. Dimensions of members shown in the figures may not accurately represent the actual dimensions or the actual dimensional ratio of the members.

FIG. 1 is a plan view that shows the configuration of the flexible printed circuit 100 of an embodiment of the present invention.

As shown in FIG. 1, flexible printed circuit 100 of the present invention has flexible base film 1, made of an insulating material such as polyimide and having a thickness of about 10 to 50 μm, and has a metal foil such as copper foil having a thickness of about 10 to 50 μm bonded to the base film 1 through an adhesive layer (not shown) to form prescribed wiring patterns 2 (2a, 2b and 2c). Wiring patterns 2 are covered with insulating protective film or protective sheet (not shown), which makes flexible printed circuit 100 a three-layer structure including base film 1 and protective film or protective sheet with wiring patterns 2 in between.

Flexible printed circuit 100 according to the present embodiment is a TCP substrate having semiconductor chip 4 at the center. The semiconductor chip 4 outputs drive signals for driving the liquid crystal panel. Wiring patterns 2 are connected to terminal region 3 formed on the back side, i.e., the side facing the wiring patterns 2, of semiconductor chip 4 through the apertures (not shown) in the protective sheet that covers the surface of the wiring patterns 2. As shown in FIG. 1, wiring patterns 2 include output wiring pattern 2a, which is connected to the output terminal of semiconductor chip 4, and input wiring pattern 2b, which is connected to the input terminal of semiconductor chip 4. Output wiring pattern 2a is drawn to the top edge of flexible printed circuit 100 as shown in FIG. 1, and input wiring pattern 2b is drawn to the bottom edge of flexible printed circuit 100 as shown in FIG. 1.

Output wiring pattern 2a has narrowed portion 2c at the edge of the flexible printed circuit 100 and its adjacent region.

Base film 1 has aperture 5a along the top edge of flexible printed circuit 100 in the area where output wiring pattern 2a is formed, and aperture 5b along the bottom edge of flexible printed circuit 100 in the area where input wiring pattern 2b is formed. Output wiring pattern 2a and input wiring pattern 2b are, through apertures 5a and 5b, exposed to the back side of flexible printed circuit 100, which is opposite the side shown in FIG. 1. Wiring patterns 2a and 2b are connected to electrode terminals on other electric circuit substrates (not shown) through the exposed portions of the wiring.

For example, on flexible printed circuit 100 according to the present embodiment, a film material containing conductive particles, which is called ACF (Anisotropic Conductive Film), is disposed over aperture 5a to establish physical and electrical connection between individual wires of output wiring pattern 2a and the corresponding electrode terminals formed on panel substrate 12 of liquid crystal panel 13. Likewise, ACF is disposed over aperture 5b to establish physical and electrical connection with corresponding electrode terminals of an external circuit substrate (not shown) that generates drive voltage and input signals for driver semiconductor chip 4.

Figure 2:
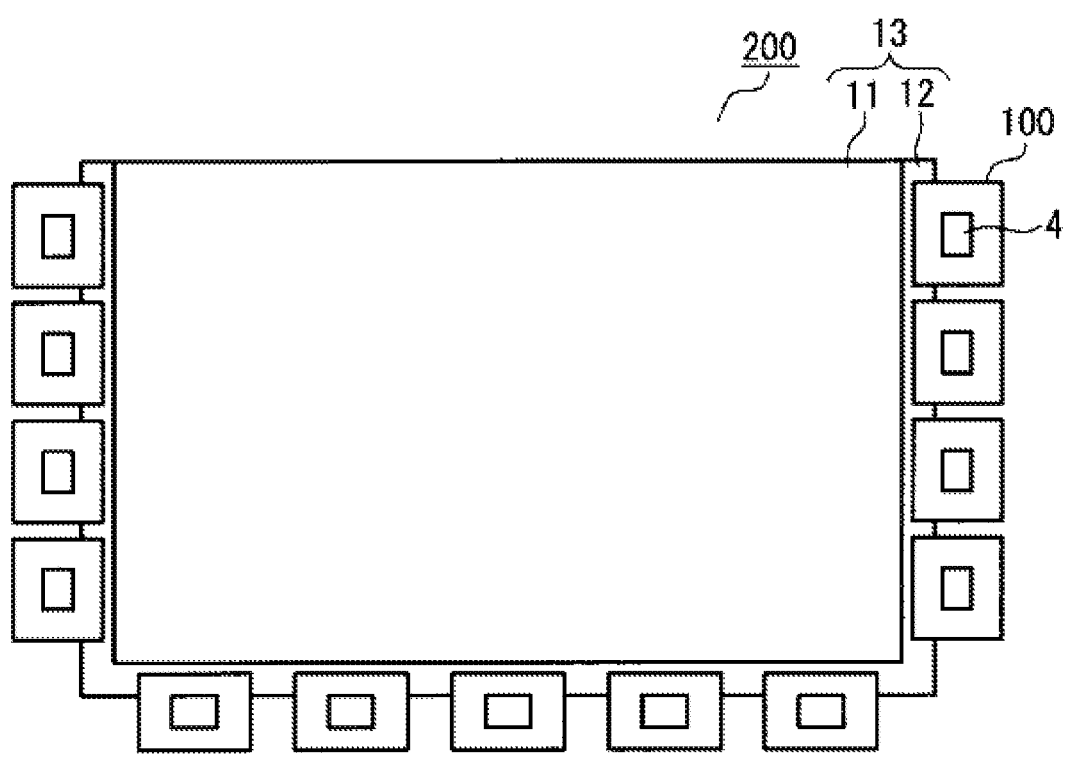
FIG. 2 is a schematic structural view of the liquid crystal display device according to an embodiment of the present invention.

FIG. 2 is a schematic structural view of the liquid crystal display device 200, which will be explained as an example of an electric circuit structure of the present invention.

As shown in FIG. 2, liquid crystal display device 200 according to the present embodiment has glass opposite substrate 11, glass panel substrate 12 on which electric circuit elements are formed, and a liquid crystal layer (not shown) between the substrates, wherein the substrates and the liquid crystal layer constitute liquid crystal panel 13. On the inner surface of opposite substrate 11, there are color filters for color image display, a unit of a color filter corresponding to each pixel, and an opposite electrode for applying predetermined voltages to the liquid crystal layer. On the inner surface of panel substrate 12, there are pixel electrodes arranged in a matrix of multiple rows and columns. The polarization condition of the liquid crystal layer is changed in accordance with the potential difference between the pixel electrodes and the opposite electrode. Therefore, the area on panel substrate 12 where the pixel electrodes are disposed is the display area of the liquid crystal panel.

The display area has a plurality of gate lines arranged in the direction of rows of the pixel electrodes, a plurality of source lines arranged in columns, and a TFT connected to a respective pixel electrode located near the intersections of the gate lines and the source lines, which intersect each other at a right angle. The inside configuration of opposite substrate 11 and panel substrate 12 is not shown in the figures.

Panel substrate 12 is slightly larger than opposite substrate 11 in surface area, and, as shown in FIG. 2, has exposed surface areas along both the right and left sides and on the side at the bottom of liquid crystal panel 13. On these exposed areas, electrode terminals (not shown) are disposed for applying predetermined voltages and signals to various wirings such as gate lines and source lines and to the electric circuit elements such as TFTs formed in the panel substrate 12. Wiring patterns 2 on flexible printed circuit 100 are connected through the ACF formed over aperture 5a to these electrode terminals. In this way, output signals from driver semiconductor chip 4 mounted on flexible printed circuit 100 are sent to individual wires disposed over panel substrate 12 of liquid crystal panel 13 for image display on liquid crystal panel 13.

When liquid crystal panel 13 is a transmissive or semi-transmissive panel, a backlight necessary to display images on liquid crystal panel 13 is placed behind liquid crystal panel 13. In this case, liquid crystal panel 13 and the backlight are encased in a bezel, a frame-like structural member having a bottom, to constitute a liquid crystal module, which is a liquid crystal display device. These components are, however, omitted in FIG. 2.

FIG. 2 shows that, for ease in explanation, flexible printed circuits 100 connected to the back panel 12 are expanded at the periphery of the panel 12. Actually, however, to minimize the outer dimension of the liquid crystal display device, flexible printed circuits 100 are bent along the sides of the bezel (not shown), with the other edge of the flexible printed circuit 100 bent and bonded to the back side of the bezel.

Configuration of liquid crystal display device 200, which is an electric circuit substrate of the present invention, shall not be limited to an embodiment shown in FIG. 2, wherein the flexible printed circuits are connected along three borders of panel substrate 12. Flexible printed circuits 100 may be connected along only one border, two borders, or all four borders of panel substrate 12. The number of flexible printed circuits 100 that are connected to each border of the panel substrate 12 is not limited either.

Figure 3:
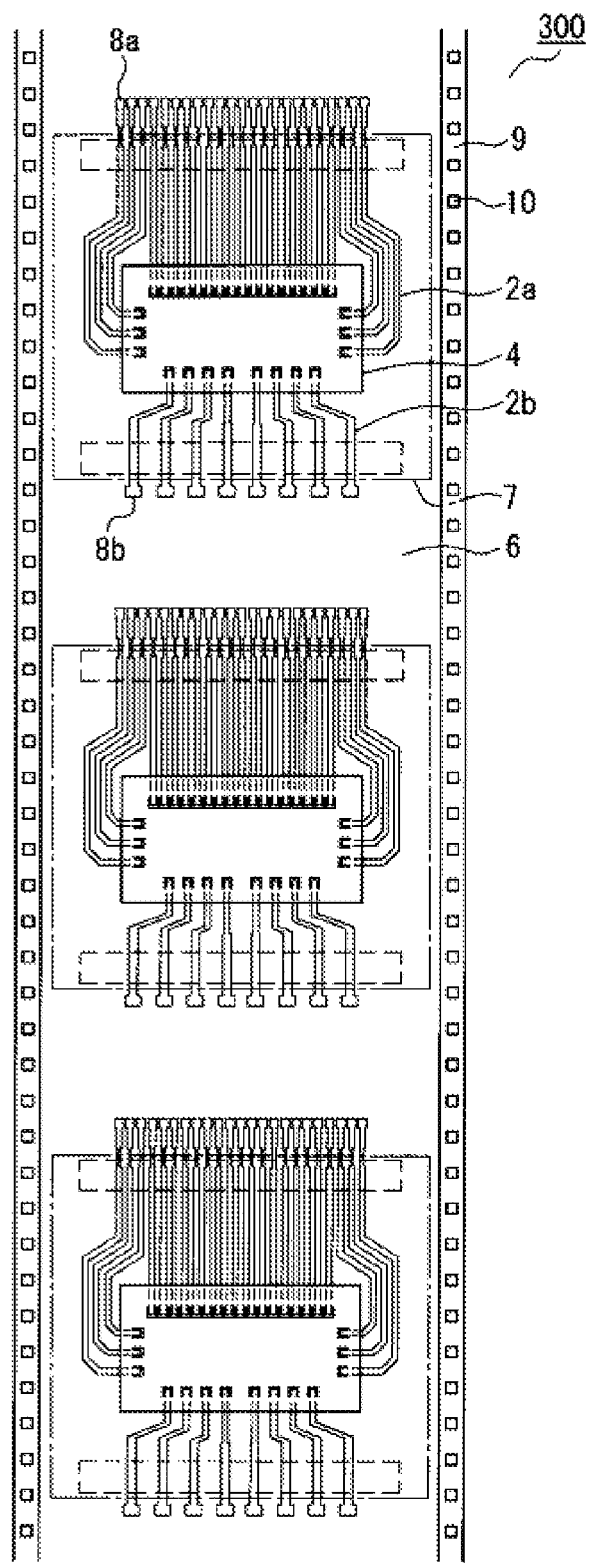
FIG. 3 is a plan view of the carrier tape on which the flexible printed circuits of an embodiment of the present invention are formed.

FIG. 3 is a plan view of a carrier tape 300 on which flexible printed circuits according to the present embodiment are formed but not punched out for separation yet.

As shown in FIG. 3, multiple flexible printed circuits 100 are formed apart from each other by a predetermined spacing on carrier tape 300. Wiring patterns 2 (2a and 2b) and semiconductor chip 4, which is a circuit element, are disposed over flexible resin base material 6, which becomes base film 1 once flexible printed circuits 100 are individually separated. Flexible printed circuits 100 according to an embodiment of the present invention are separated when individual patterns on carrier tape 300 are punched out along the prescribed punching line 7. Note that punching line 7 is actually not visible as shown in FIG. 3; it only represents the contour of the punching device (not shown).

Wiring patterns 2 on the base material 6 of carrier tape 300 extend beyond punching line 7, wherein each wire in output wiring pattern 2a and input wiring pattern 2b has test pads 8a and 8b, respectively, located beyond the punching line 7, which test pads are wider than other part of wires in wiring patterns 2a and 2b. Test pads 8a and 8b of flexible printed circuit 100 according to the present embodiment can be used for testing the electrical properties of wiring patterns 2a and 2b and semiconductor chip 4, which is the mounted circuit element, before flexible printed circuits 100 are punched out from carrier tape 300.

Guides 9 along the sides of carrier tape 300 have catch holes 10 for reeling in and out the carrier tape 300 for processes such as formation of wiring patterns 2, mounting of semiconductor chip 4, and punching out of the flexible printed circuits 100.

Figure 4:
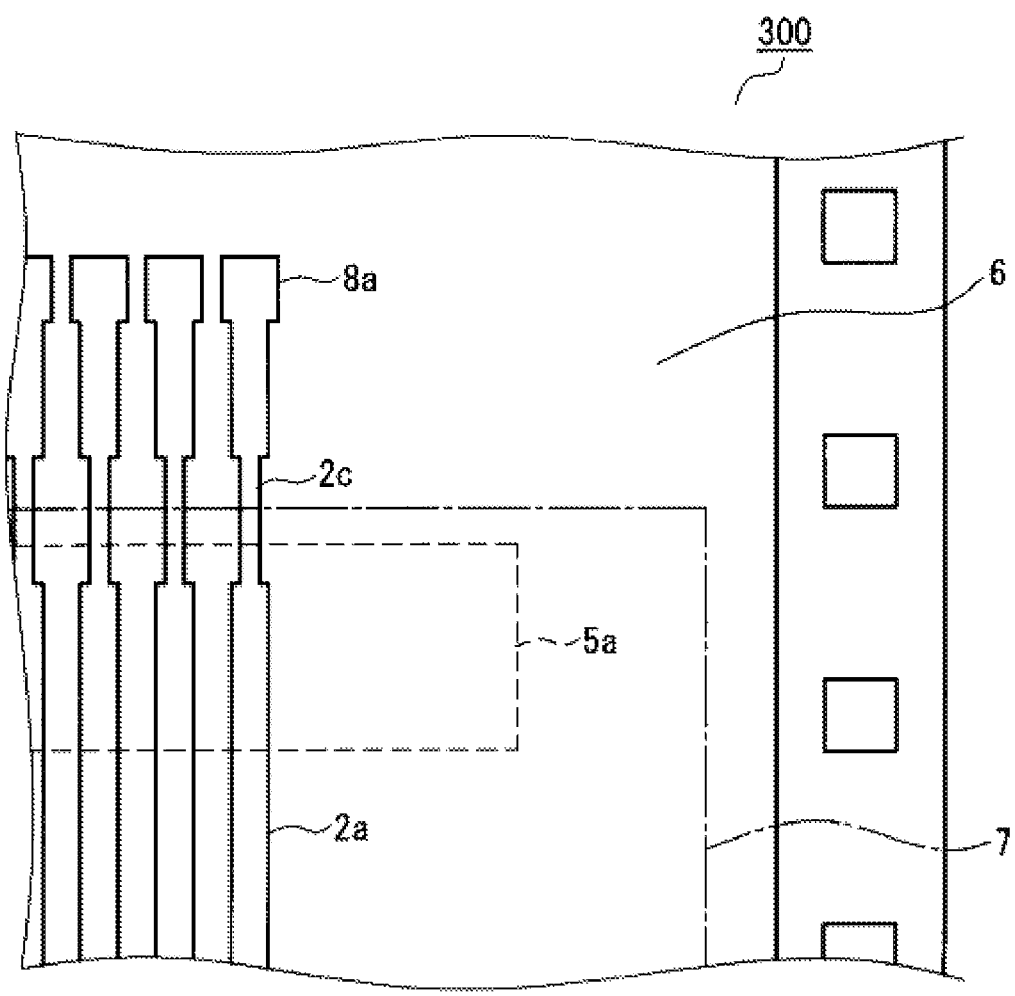
FIG. 4 is an enlarged view of a part of the flexible printed circuit of an embodiment of the present invention, before the flexible printed circuit is punched out from the carrier tape.

FIG. 4 is an enlarged plan view of a portion of flexible printed circuit 100 before being punched out from carrier tape 300, showing the region around punching line 7 over output wiring pattern 2a.

As shown in FIG. 4, each wire of the output-side wiring pattern 2a has a narrowed portion 2c in the vicinity of the punching line 7. In other words, each wire of output wiring pattern 2a has a certain width throughout their length over aperture 5a formed in the base material 6 of carrier tape 300, up to the vicinity of punching line 7, where the wire narrows down to form a narrowed portion 2c. Beyond this vicinity, the wire regains the original width, and then becomes wider towards the end to form the testing pad 8a.

Since the narrowed portion 2c of each wire of output wiring pattern 2a on flexible printed circuit 100 according to the present embodiment intersects punching line 7, narrowed portion 2c constitutes a part of an edge of base film 1 once the flexible printed circuit 100 is punched out. Thus, any wiring pattern swarf generated from punching out the flexible printed circuit by the cutting die has a length not greater than the width of narrowed portion 2c.

Employment of narrowed portion 2c on output wiring pattern 2a in the vicinity of punching line 7 makes the length of wiring pattern swarf generated from punching out shorter than the swarf that would result from cutting the output wiring pattern 2a with its full width that does not have narrowed portion 2c.

As described earlier, flexible printed circuit 100 according to the present embodiment includes resin base material 6, which is base film 1, over which wiring patterns 2 of metal foil are formed via an adhesive layer. Flexible printed circuits 100 are individually separated by being punched out from the base material by a cutting die. The base material 6 has certain flexibility, and wiring patterns 2 disposed on the adhesive layer may be stretched and deformed when subjected to external force from cutting. For these reasons, wiring pattern swarf generated from punching out cannot completely be avoided even if quality control of the shape of the cutting die and edge sharpness is sufficiently managed.

Also, because the swarf easily sticks to base film 1 of separated flexible printed circuit 100 due to static electricity, complete removal of the swarf from individually separated flexible printed circuit 100 is extremely difficult. Wiring pattern swarf adhered to flexible printed circuit 100, which is practically unavoidable as described above, can then reach the connection area that connects flexible printed circuit 100 to other electric circuit substrates, and could bridge across the adjacent electrode terminals, causing a short-circuit failure. Flexible printed circuit 100 according to the present embodiment, however, shortens the length of any wiring pattern swarf that could be generated from punching out as described above, thereby reducing the chance that the swarf bridges across adjacent electrode terminals, which effectively prevents short-circuit failure occurrences.

Swarf length could be made shorter simply by reducing the width of individual wires of wiring patterns 2 throughout their length. However, excessive reduction in width of wires in wiring patterns 2 reduces the strength of the wiring pattern 2, which makes it difficult to form certain shapes on base film 1. Reduction in width of wires in wiring patterns 2 can also contribute to poor conductivity between wiring patterns 2 and the electrode terminals formed on other electric circuit substrate due to the reduced contact area between them. In particular, when ACF is used for electrical connection, narrow wires of wiring patterns 2 make it difficult for conductive particles of the ACF to make contact with wiring patterns 2, thereby increasing the chance of occurrence of poor conductivity. Therefore, as shown in FIG. 4, each wire in output wiring pattern 2a preferably retains its full width at least in the vicinity of aperture 5a, i.e., the connection area through which flexible printed circuit 100 is connected with electrode terminals formed on other electric circuit substrate, and narrowed portion 2c is preferably formed along the edge of base film 1 of flexible printed circuit 100, that is, along the punching line 7.

Figure 5:
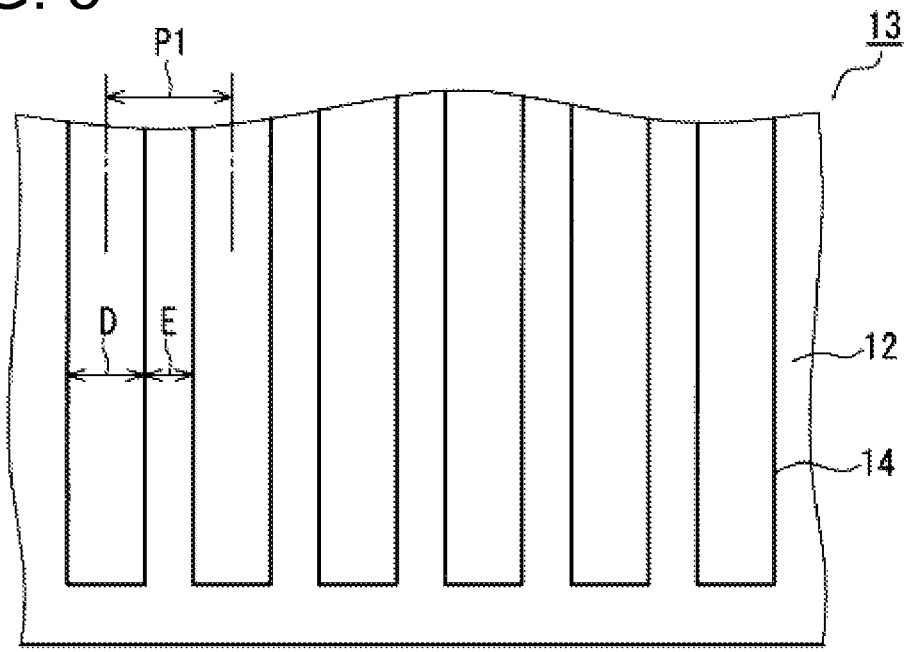
FIG. 5 shows the relationship between the wiring pattern of the flexible printed circuit of an embodiment of the present invention and the electrode terminals on the electric circuit substrate to which the flexible printed circuit is connected.
Figure 5:
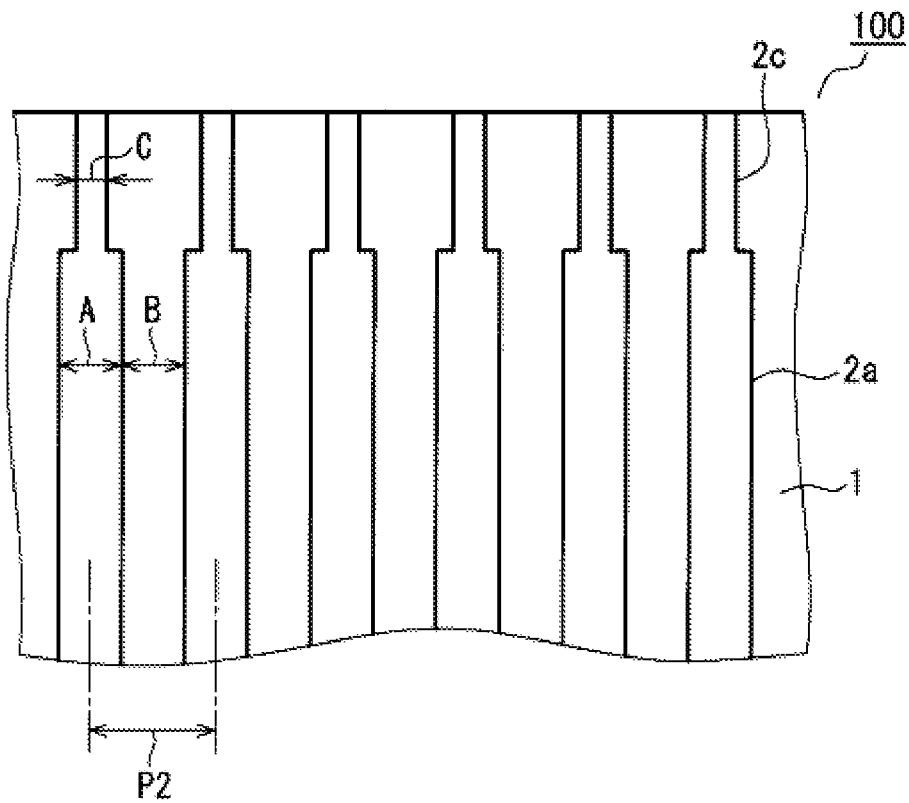

FIG. 5 shows the relationship between the border area of flexible printed circuit 100 and electrode terminals 14 formed on panel substrate 12, the electric circuit substrate to which flexible printed circuit 100 is connected.

As shown in FIG. 5, the pitch P2 of output wiring patterns 2 on flexible printed circuit 100 and the pitch P1 of electrode terminals 14 on panel substrate 12, to which output wiring pattern 2a is connected, are equal. However, to accommodate any reduced conductive area resulting from misalignment in the placement of flexible printed circuit 100 or misalignment caused by stretched material, electrode terminals 14 have a width "D" which is larger than width "A" of output wiring pattern 2a. That is, interval "E" between adjacent electrode terminals 14 is smaller than interval "B" between wires of output wiring pattern 2a.

Here is a numerical design example. If the pitch P2 of output wiring pattern 2a and the pitch P1 of electrode terminals 14 are both 50 μm, both width "A" of output wiring pattern 2a and interval "B" are often set to 25 μm, and the width "D" of electrode terminal 14 and the interval "E" are often set to 35 μm and 15 μm, respectively, making the width "D" of electrode terminals 14 larger.

If width "C" of narrowed portion 2c of output wiring pattern 2a is set to a smaller value than interval "E" of the electrode terminals 14, for example, to 13 μm, a half value of the width of output wiring pattern 2a in the example above, any swarf generated from narrowed portion 2c has a length "C", which is shorter than interval "E" of electrode terminals 14. Consequently, the wiring pattern swarf would not bridge the adjacent electrode terminals 14, and therefore short-circuit failures would not occur. In summary, employment of narrowed portion 2c effectively prevents short-circuit failures caused by wiring pattern swarf of the wiring pattern 2 from occurring even when the width "D" of electrode terminal 14 is set wide and, as a consequence, the interval "E" of electrode terminals 14 becomes smaller than width "A" of output wiring pattern 2a.

Although in the above description of flexible printed circuit 100 of the present embodiment, flexible printed circuit 100 is described as a TCP substrate on which semiconductor chip 4, a circuit element, is mounted, the flexible printed circuit 100 of the present invention is not limited to such a flexible printed circuit. The structure of the present invention is equally effective for a flexible printed circuit with no circuit element mounted on it.

The embodiment described above shows an example wherein testing pads 8a and 8b of the wiring pattern are formed outside the punching line on carrier tape 300. Testing pads 8a and 8b, however, are not essential in the present invention even when flexible printed circuit 100 is a TCP substrate. The effect of the present invention will be apparent as long as wiring patterns 2 intersect punching line 7 and narrowed portion 2c is formed around the intersections. Needless to say, cases in which wiring patterns 2 are not widened to the original width beyond the intersection with punching line 7 as shown in FIG. 4, and end as narrow wires, shall also be considered as an embodiment of the present invention.

Although, in the embodiments disclosed above, a configuration where narrowed portion 2c is employed only on output wiring pattern 2a of the wiring pattern 2 is described, the present invention is not limited to these embodiments only. The configuration where a narrowed portion is employed on input wiring pattern 2b as well shall also be considered as an embodiment of the present invention. Preferably, whether to employ narrowed portion or not, and the width of the narrowed portion shall be determined case by case with consideration of the width of wiring patterns formed on the flexible printed circuit and the interval between the adjacent electrodes of electrode terminals on the electric circuit substrate to which the flexible printed circuit is connected as well as the length of possible swarf that could be generated.

Industrial Applicability

The present invention is industrially applicable as flexible printed circuits which are individually separated by being punched out along with wiring patterns disposed on them; as an electric circuit structure having such a flexible printed circuit and an electric circuit substrate to which the flexible printed circuit is connected; as a liquid crystal display device wherein such an electric circuit substrate is a panel substrate that is a component of the liquid crystal panel; and as a module having electric circuit substrates for various purposes.

The invention claimed is:

1. An electric circuit structure comprising:

a flexible printed circuit comprising a flexible base film and a wiring pattern disposed on the flexible base film, the wiring pattern including a plurality of terminals arranged side-by-side, each of the plurality of terminals having a narrowed portion extending to an edge of the flexible base film; and an electric circuit substrate having a plurality of electrode terminals thereon, the plurality of electrode terminals being arranged side-by-side with a prescribed spacing therebetween, wherein the plurality of terminals of the wiring pattern are attached to the plurality of electrode terminals of the electric circuit substrate, respectively, to establish physical and electrical connection therebetween, and wherein a width of the narrowed portion of each of the plurality of terminals of the wiring pattern is smaller than the prescribed spacing of the plurality of electrode terminals of the electric circuit substrate.

2. The electric circuit structure according to claim 1, wherein said electric circuit structure is a liquid crystal display device, and said electric circuit substrate is a panel substrate that, together with an opposite substrate to which the panel substrate is bonded, constitutes a liquid crystal panel, wherein a liquid crystal layer is disposed within a gap of predetermined width between the panel substrate and the opposite substrate.

3. The electric circuit structure according to claim 1, wherein the flexible printed circuit is punched out from a carrier tape, and wherein when the flexible printed circuit is attached to the carrier tape, the narrowed portion of the wiring pattern being extended across a punching line so that upon punching out the flexible printed circuit from the carrier tape, the narrowed portion extends to the edge of the punched-out base film.

4. The electric circuit structure according to claim 1, wherein the plurality of terminals of the flexible printed circuit are attached to the plurality of electrode terminals of the electric circuit substrate via an anisotropic conductive film disposed between the plurality of terminals of the flexible printed circuit and the plurality of electrode terminals of the electric circuit substrate.

5. The electric circuit structure according to claim 1, wherein the flexible printed circuit further comprises a protective film or protective sheet formed on the wiring pattern on the base film, and wherein the base film has an opening to expose a backside of the wiring pattern, and the exposed wiring pattern is attached to the plurality of electrode terminals of the electric circuit substrate.

6. The electric circuit structure according to claim 1, wherein the plurality of terminals of the wiring pattern are arranged side-by-side with a prescribed spacing therebetween, and wherein the prescribed spacing of the plurality of electrode terminals of the electric circuit substrate is smaller than the prescribed spacing of the plurality of terminals of the wiring pattern of the flexible printed circuit.

* * * * *